(12) United States Patent
Lee et al.

(10) Patent No.: US 9,885,567 B2
(45) Date of Patent: Feb. 6, 2018

(54) SUBSTRATE PLACEMENT DETECTION IN SEMICONDUCTOR EQUIPMENT USING THERMAL RESPONSE CHARACTERISTICS

(71) Applicant: APPLIED MATERIALS, INC., Santa Clara, CA (US)

(72) Inventors: Jared Ahmad Lee, Santa Clara, CA (US); Martin Jeffrey Salinas, San Jose, CA (US); Yi Zhou, Fremont, CA (US); Changhun Lee, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 577 days.

(21) Appl. No.: 14/470,236

(22) Filed: Aug. 27, 2014

(65) Prior Publication Data
US 2015/0063405 A1 Mar. 5, 2015

Related U.S. Application Data

(60) Provisional application No. 61/870,552, filed on Aug. 27, 2013.

(51) Int. Cl.
*G01N 25/00* (2006.01)
*G01B 21/00* (2006.01)
*H01L 21/67* (2006.01)

(52) U.S. Cl.
CPC ........ *G01B 21/00* (2013.01); *H01L 21/67259* (2013.01)

(58) Field of Classification Search
None
See application file for complete search history.

(56) References Cited

U.S. PATENT DOCUMENTS

| | | | |
|---|---|---|---|
| 2009/0214758 A1* | 8/2009 | Kannan | C23C 16/34 427/8 |
| 2011/0174800 A1* | 7/2011 | Chino | C23C 16/4583 219/446.1 |
| 2012/0227955 A1* | 9/2012 | Koshimizu | G05D 23/1919 165/281 |

* cited by examiner

*Primary Examiner* — Erica Lin
(74) *Attorney, Agent, or Firm* — Moser Taboada; Alan Taboada

(57) ABSTRACT

Methods and apparatus for determining proper placement of a substrate upon a substrate support in a process chamber are disclosed. In some embodiments, a method for detecting substrate placement in a process chamber includes placing a substrate on a support surface of a substrate support within the process chamber; modifying a pressure within the chamber to create a detection pressure within the chamber; sensing a first temperature of the substrate support; monitoring a thermal response characteristic of the substrate support after placing the substrate on the substrate support; comparing the thermal response characteristic to a predetermined response characteristic; and determining whether the substrate is placed correctly based upon the comparison of the thermal response characteristic to the predetermined response characteristic.

19 Claims, 2 Drawing Sheets

SUBSTRATE PLACEMENT DETECTION IN SEMICONDUCTOR EQUIPMENT USING THERMAL RESPONSE CHARACTERISTICS

CROSS-REFERENCE TO RELATED APPLICATIONS

This application claims benefit of U.S. provisional patent application Ser. No. 61/870,552, filed Aug. 27, 2013, which is herein incorporated by reference.

FIELD

Embodiments of the present disclosure generally relate to semiconductor manufacturing.

BACKGROUND

Various semiconductor manufacturing processes utilize substrate supports to support a substrate for processing in a process chamber. Proper placement of the substrate on the substrate support is usually a prerequisite for the implementation of a substrate process. Substrate misplacement on the substrate support could cause serious process or transfer problems, negatively impacting the efficiency of the process. For example, the inventors have observed that defective substrates, produced due to improper placement of the substrate on the substrate support, decrease the efficiency of the process. Detection of a misplaced substrate prior to initialization of the process may prevent the production of defective substrates.

Accordingly, the inventors have provided an apparatus and method for detecting placement of a substrate on a substrate support.

SUMMARY

Methods and apparatus for determining proper placement of a substrate upon a substrate support in a process chamber are disclosed. In some embodiments, a method for detecting substrate placement in a process chamber includes placing a substrate on a support surface of a substrate support within the process chamber; modifying a pressure within the chamber to create a detection pressure within the chamber; sensing a first temperature of the substrate support; monitoring a thermal response characteristic of the substrate support after placing the substrate on the substrate support; comparing the thermal response characteristic to a predetermined response characteristic; and determining whether the substrate is placed correctly based upon the comparison of the thermal response characteristic to the predetermined response characteristic.

In some embodiments, a method for substrate placement detection comprises a computer readable medium having instructions stored thereon that, when the instructions are executed, cause a method for substrate placement detection on a substrate support in a process chamber to be performed. The method may be any of the substrate detection methods described herein.

In some embodiments, a system for processing a substrate includes a chamber defining a processing volume; a pressure sensor coupled to the chamber to sense a pressure in the processing volume; a substrate support comprising a temperature sensor disposed within the processing volume; a placement device to place a substrate upon a surface of the substrate support; a pressure modification system to modify a pressure within the processing volume; and a controller comprising a computer readable medium having instructions stored thereon that, when the instructions are executed, cause a method for substrate placement detection on a substrate support in a process chamber to be performed. The method may be any of the substrate detection methods described herein.

In some embodiments, a method for detecting substrate placement in a process chamber includes placing a substrate on a support surface of the substrate support; monitoring a thermal response characteristic of the substrate support after placing the substrate on the substrate support; and determining whether the substrate is placed correctly based upon the monitored thermal response characteristic.

Other and further embodiments are discussed below.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Embodiments of the present disclosure provide methods and apparatus for detection of substrate placement on a substrate support in a process chamber. Embodiments of the present disclosure may be used, in a non-limiting example, in substrate process chambers which include thermally controlled substrate supports, for example in heated or cooled substrate supports. In some embodiments, the present disclosure may be used in combination with a suitable modified dual load lock chamber as described in PCT Patent Application Publication WO2012118897, published Sep. 7, 2012, entitled "Abatement and Strip Process Chamber in a Dual Loadlock Configuration", although other types of process chambers used in semiconductor fabrication may also benefit from embodiments of the present disclosure.

Figure 1:
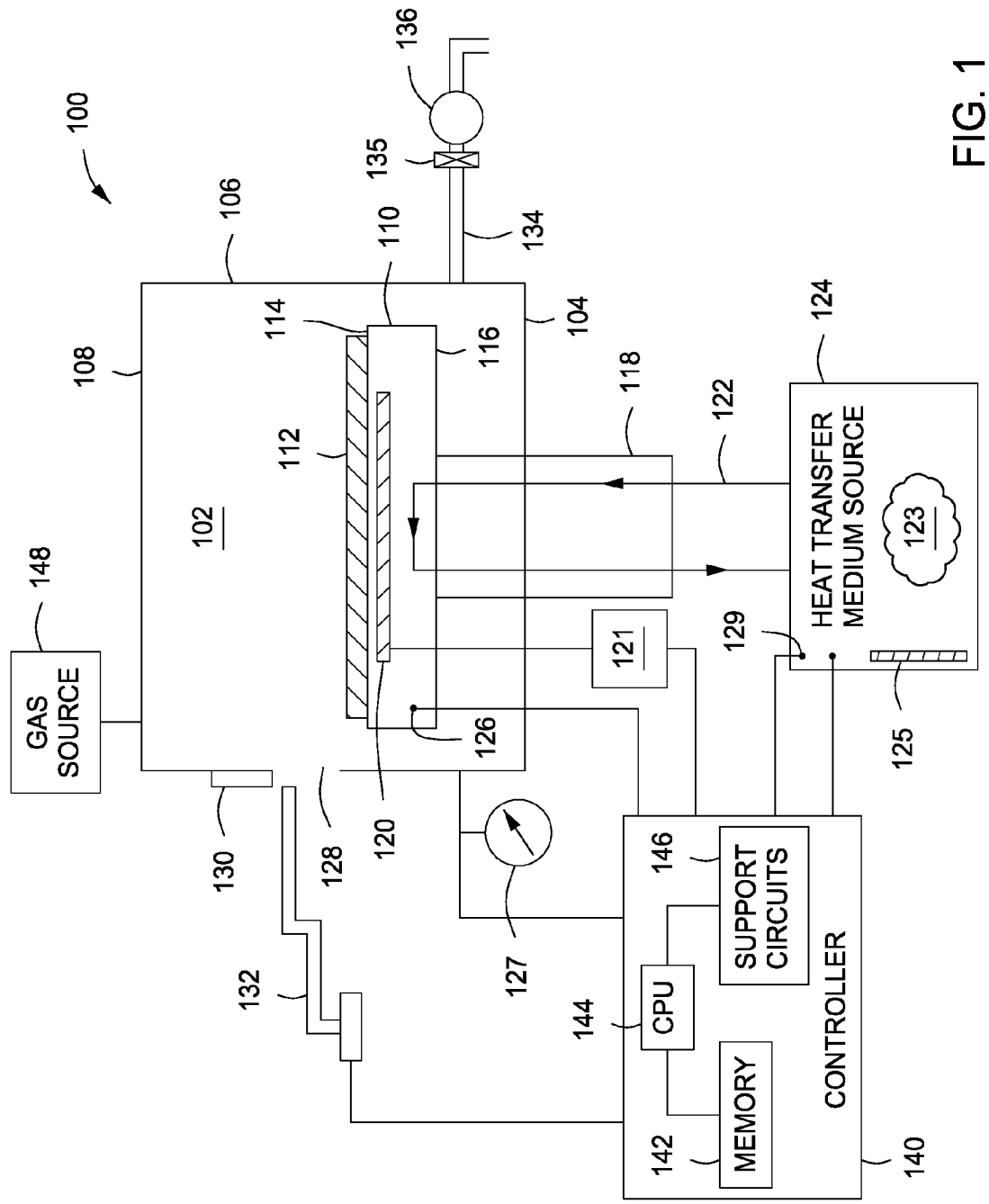
FIG. 1 depicts a schematic view of a chamber body in accordance with some embodiments of the present disclosure.

FIG. 1 is a schematic view of an illustrative substrate process chamber or chamber 100 in accordance with some embodiments of the present disclosure. The chamber 100 includes a processing volume 102 that is defined by a floor 104, one or more sidewalls 106, and a roof or lid 108.

A substrate support 110 may be disposed within the processing volume 102 to support a substrate 112 during processing. In some embodiments, the substrate support 110 may be formed from metal, such as aluminum, or other process compatible materials, such as ceramic. The substrate support may be supported by a support shaft 118, which may support the substrate support 110 in a fixed position or in a vertical displacement, a rotational displacement, or both vertical and rotational displacement, within the processing volume 102.

In some embodiments, the substrate support 110 includes a heating element 120 disposed between an upper surface, for example substrate support surface 114, and a lower surface 116. The heating element 120 may be a resistive heater or the like. The heating element 120 may be coupled a power supply 121, for example a DC power supply, to provide power to the heating element 120. The power supply 121 is coupled to a controller 140 (discussed below) to regulate and monitor the power provided to the heating element 120 in maintaining the temperature of the substrate support 110. The power data related to the heating element may be recorded, for example, stored in the memory 142.

In some embodiments, the substrate support 110 may also include conduit 122 to provide a heat transfer medium 123 from a heat transfer medium source 124 to the substrate support 110 to regulate the temperature of the substrate support 110. The heat transfer medium source 124 may include a heating or cooling element 125 (such as a heater or a chiller) and temperature sensor 129, each coupled to the controller 140. The controller 140 may monitor the temperature of the heat transfer medium 123 via the temperature sensor 129 and may regulate, and monitor the power provided to the heating or cooling element 125, and therefore to the heat transfer medium 123, to regulate the temperature of the substrate support 110. The temperature and power data related to the heat transfer medium may be recorded, for example, stored in the memory 142.

The substrate support 110 may also include one or more temperature sensors 126 (one shown) disposed within the substrate support 110 between the substrate support surface 114 and the lower surface 116. The one or more temperature sensors 126 may be coupled to the controller 140 to provide substrate support temperature data to the controller 140, where the temperature data may be recorded, for example, stored in the memory 142.

In some embodiments, the chamber 100 may comprise an opening 128 (such as a slit valve opening) to allow for the substrate 112 to be provided to, and removed from, the chamber 100. The opening 128 may be selectively sealed via a slit valve door 130, or other mechanism for selectively providing access to the processing volume 102 of the chamber 100 through the opening 128. In some embodiments a mechanical device, for example robot 132, may be provided to facilitate placing the substrate 112 on the substrate support surface 114 and removing the substrate from the substrate support surface 114. The robot 132 may be coupled to, and controlled by, the controller 140, or by some other controller.

In some embodiments, the chamber 100 further includes an exhaust 134 coupled to a pump 136 through a valve 135 for removing process gases, purge gases, processing byproducts, and the like from the chamber 100. The pump 136 and valve 135 may also regulate the pressure within the processing volume 102. The chamber 100 may include a pressure sensor 127 configured to sense the pressure within the processing volume 102 of the chamber 100.

In some embodiments a controller 140 comprises a memory 142, a central processing unit (CPU) 144, and support circuits 146 and facilitates monitoring and control of the components of the chamber 100 and of the processes tasking place within the chamber 100. In some embodiments, the controller 140 receives data, for example temperature data from temperature sensor 126 and/or temperature sensor 129, pressure data from pressure sensor 127, for storage or manipulation related to the calculation of process conditions (to be described below). The controller may also receive data from the robot 132 regarding, for example, the position or speed of the robot 132, or the presence of a substrate 112 to be placed on, or removed from, the substrates support 110.

To facilitate control of the chamber 100, for example, the controller 140 may be one of any form of general-purpose computer processor that can be used in an industrial setting for controlling various chambers and sub-processors. The memory 142 of the CPU 144 may be one or more of readily available computer-readable memory media such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, power monitoring circuitry, clock circuits or timers, input/output circuitry and subsystems, and the like.

The inventive methods, or at least portions thereof, described herein may be stored in the memory 142 as a software routine. The software routine may also be stored and/or executed by a second CPU (not shown) that is remotely located from the hardware being controlled by the CPU 144. The software routine, when executed by CPU 144, transforms the general purpose computer into a specific purpose computer (controller 140) that controls the system operation such as that for determining placement of the substrate 112 upon the substrate support surface 114. Although embodiments of the present disclosure are discussed as being implemented as a software routine, some of the processes disclosed herein may be performed in hardware as well as by the software controller. As such, embodiments of the present disclosure may be implemented in software as executed upon a computer system, and hardware as an application specific integrated circuit or other type of hardware implementation, or a combination of software and hardware.

Proper placement of the substrate 112 on the substrate support surface 114 can include, among other things, placement of the substrate 112 wholly within the boundaries of the substrate support surface 114, and placement of the substrate 112 such that intimate surface contact between the substrate 112 and the substrate support surface 114 over all, or substantially all, of the interface area is established. Improper placement of the substrate 112 on the substrate support surface 114 can be caused by robot 132 error resulting in placement of the substrate 112 outside the limits of the substrate support surface 114 or placement of the substrate 112 on contamination or debris on the substrate support surface 114, interfering with surface contact between the substrate 112 and the substrate support surface 114.

In conventional substrate processing, a substrate is placed on a substrate support surface within a chamber by a mechanical actuator, such as a robot, acting through an opening in the chamber, for example a slit valve. The chamber is prepared for processing by, among other things, sealing the chamber (for example, by closing the slit valve) and adjusting the pressure within the chamber. Some substrate supports, for example those using an electrostatic chuck (ESC) and backside gas, may be capable of determining if the substrate is correctly placed during processing by, for example, monitoring the backside pressure leak rate. However, other substrate supports, for example substrate supports without backside gas or non-chucking hot substrate supports, lack the ability to determine proper placement of the substrate in real time (for example, during the execution of the recipe). The lack of such ability may allow substrate processing to proceed with an improperly placed substrate leading to poor process uniformity and potential substrate breakage, creating a risk of processing defective substrates which would only be identified by subsequent quality control tests. In order to overcome this problem, apparatus and methods for detecting the placement of a substrate upon a substrate support are provided that advantageously facilitate determining proper substrate placement in real time such that corrective action may be taken before initiation of a recipe. Substrate placement detection is part of the disclosed method, allowing misplaced substrates to be detected immediately (i.e., during processing), instead of having many substrates run through the process with potentially the same problem.

Figure 2:
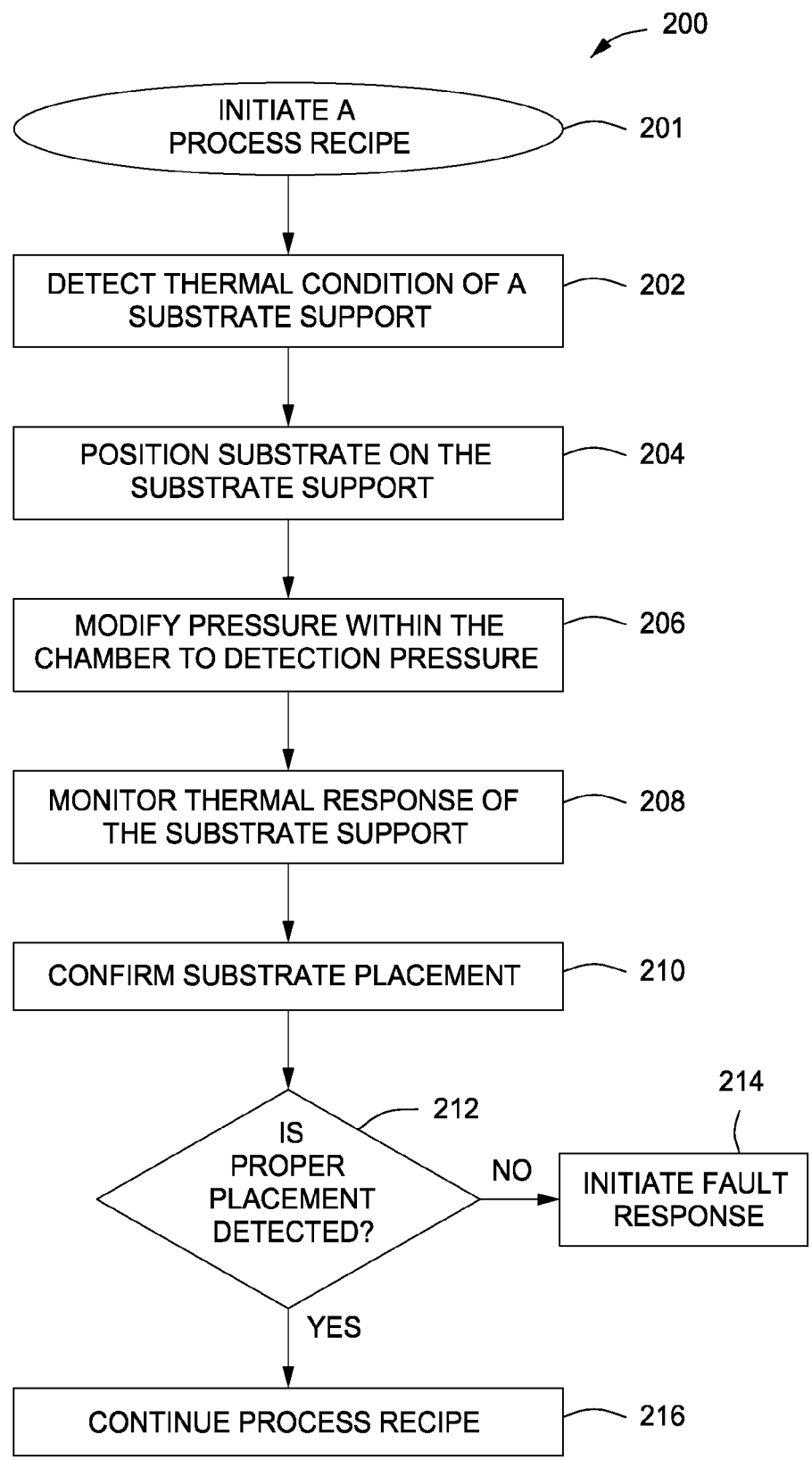
FIG. 2 is a flow chart depicting a method in accordance with embodiments of the present disclosure.

For example, FIG. 2 depicts a method 200 of detecting the placement of a substrate in accordance with some embodiments of the present disclosure. The method 200 may be performed, for example, with the illustrative apparatus disclosed in FIG. 1, above. The method 200 generally begins at 201 where, optionally, a recipe is initiated in an associated chamber, for example, chamber 100.

At 202, an initial temperature of a substrate support 110 is detected. The temperature may be detected by temperature sensor 126 (and/or correlation to the temperature of the heat transfer medium 123 measured by the temperature sensor 129) and communicated to the controller 140. The detected temperature may be compared to a temperature or temperature related data stored in the memory 142 (i.e., historical data). The temperature related data may include previously detected and stored temperatures, or data entered and stored in the memory 142 as theoretical values, empirical values, or values otherwise determined or selected. The historical data may be modified by the detected temperature, for example the detected temperature may be summed with, or averaged into, the historical data and stored as new historical data. The initial temperature of the substrate support 110 may be stored to facilitate calculation of a temperature gradient or a timed change in temperature of the substrate support 110.

At 204, a substrate 112 is placed on a substrate support surface 114 of the substrate support 110. This may be achieved, for example, through cooperation of the robot 132, the slit valve door 130, the substrate support 110, and the controller 140. For example, under the control of the controller 140, the robot 132 transfers a substrate from a location outside of the chamber 100 to the opening 128 in the chamber wall 106 as the slit valve door 130 moves to open the processing volume 102 to the environment outside the processing volume 102. The controller may also position the substrate support 110 in a position to facilitate the placement of the substrate 112 on the substrate support surface 114. Once the substrate 112 is placed on the substrate support 110, the robot 132 retracts from the opening 128 and the slit valve door 130 closes to seal the processing volume 102 from the outside environment. In some embodiments, it has been found desirable to detect the initial temperature of the substrate support 110 after the substrate 112 is placed on the substrate support 110. Accordingly, in some embodiments 204 may precede 202.

At 206, the pressure in the chamber 100 may be modified, for example by selectively introducing a gas from gas source 148 to the chamber while operating the pump 136 to increase the pressure within the processing volume 102, until a predetermined detection pressure is detected by the pressure sensor 127. The pressure inside the processing volume 102 may be maintained at or above the detection pressure by the selective introduction of a gas and operation of the valve 135 and pump 136. The detection pressure may be a pressure between about 0 Torr and about 20 Torr, for example, between about 0.5 Torr and about 5 Torr, for example about 2 Torr.

In some embodiments, a detection time is initiated when the detection pressure is reached, and the detection time continues for a predetermined period of time while the pressure within the chamber 100 remains at or greater than the detection pressure. The detection pressure and detection time may be individually selected for specific recipes. One or more thermal response characteristics may be monitored for the duration of the detection time. The predetermined period of time may vary with the specific recipe executed and may range from about 0.5 seconds (about instantaneous) to about 30 seconds, for example about 10 seconds.

At 208, the thermal response of the substrate support 110 to the presence of the substrate 112 is monitored. Monitored thermal response characteristics may include one or more of a temperature of the substrate support, a temperature of a heat transfer medium provided to the substrate support, or a power requirement of a thermal element in the substrate support. Monitored thermal response characteristics may be manipulated to produce calculated thermal responses useful in determining proper substrate placement. Calculated thermal responses may include one or more of change of substrate support temperature with respect to time, change in power requirement of a thermal element in the substrate support with respect to time, and output percentage (e.g., the scaled (0-100%) power output from the heater, as requested from the controller). In some embodiments, the output percentage is the same as the "power requirement" mentioned above. In addition, the output percentage can be based upon the absolute value or the change versus time. Other monitored or calculated thermal response characteristics may also be used to assist in determining proper substrate placement. Any group of the monitored and calculated thermal response characteristics can be referred to as the thermal condition of the substrate support.

At 210, substrate placement is evaluated for proper or improper placement on the substrate support. According to embodiments of the present disclosure, during the detection time, placement of the substrate 112 on the substrate support surface 114 is evaluated by comparing one or more monitored or calculated thermal response characteristics of the substrate support 110 to a predetermined thermal response characteristic for the thermal response characteristic(s) used. When more than one characteristic is used, each characteristic may be compared to a predetermined value for that characteristic. A logic algorithm may be employed, for example an algorithm using "and", "or", or "and/or" conditions, to compare the predetermined and monitored characteristics to determine the appropriate response. In embodiments comparing multiple thermal response characteristics, the characteristics may include contemporaneously obtained thermal response values.

Proper or improper placement of the substrate 112 on the substrate support surface 114 may be determined by comparing one or more of the monitored and calculated thermal response characteristics to an associated threshold value for each characteristic. For example, when a substrate 112 at a lower temperature than the substrate support 110 is placed on a substrate support surface 114 in a processing volume 102 and the detection pressure is reached, the substrate support temperature will drop. Thermal response characteristics include such non-limiting examples as: a monitored temperature drop, or a calculated rate of temperature drop, may be indicative of the condition (ex., proper or improper placement) of the substrate on the substrate support. A substrate 112 properly placed on, and in intimate contact with, the substrate support surface 114 will cause the substrate support temperature to drop at a greater rate than an improperly placed substrate.

Alternately, or in combination, the power drawn by a heating element 120 to maintain the substrate support 110 at a desired temperature as sensed by temperature sensor 126 may be monitored and compared to a threshold value stored in the memory 142. A substrate 112 properly placed on, and in intimate contact with, the substrate support surface 114 will be associated with a greater thermal load on the substrate support, and the heating element 120, to maintain a desired substrate support temperature than the draw associated with an improperly placed substrate. Monitoring the power draw of the heating element 120, or the timed change in power draw, may be indicative of the condition (ex., proper or improper placement) of the substrate upon the substrate support surface 114.

Similarly, the heat transfer medium 123 will have a different response to a properly placed substrate than to an improperly placed substrate. Monitoring characteristics of the heat transfer medium, for example the temperature of the heat transfer medium 123, or the rate of temperature change of the heat transfer medium 123, may indicate, or help to indicate, the condition (ex., proper or improper placement) of the substrate 112 upon the substrate support surface 114.

A substrate 112 properly placed on the substrate support surface 114 may result in a predictable thermal response of the substrate support 110. The predicted response may be theoretically calculated and entered into the memory 142 for comparison with the measured response in some scenarios. In other scenarios, the predicted response can be established empirically from historical thermal response data. In some cases, a predicted response may comprise a theoretically calculated response modified by historical data.

At 212 a query is made if a proper placement is detected based on the evaluation at 210. The query may compare one or more current measured or calculated thermal response value with the associated target or threshold values, evaluating if the current value corresponds to the threshold. The query may compare the current value to a specific value, or may compare the current value to a range of threshold values, either a fixed range or a percentage of the threshold value. Other evaluation criteria may also be used in evaluating the substrate placement.

If the query is answered in the negative, a fault response is initiated at 214. The fault response may be any process suitable fault response to signal an improperly placed substrate. Non-limiting examples of suitable fault responses may include a display at a machine-operator interface, or an interruption of production. The interruption of production may be immediate or may be delayed (for example, until completion of processing the substrate).

If a proper substrate placement is detected, the process recipe continues at 216. Alternatively, if no process recipe was initiated at 201, a process recipe may selected and processing of the substrate may begin.

In some embodiments of the present disclosure, the instructions of FIG. 2 may be stored on a computer readable medium in a non-volatile form, such that when executed, the instructions cause the method of substrate placement detection on a substrate support to be enacted. The computer readable medium may be executed by a controller coupled to a substrate process chamber, such as the controller 140 coupled to chamber 100.

Thus, embodiments of method and apparatus for substrate placement detection have been provided herein. Benefits of the disclosed disclosure may include improved substrate processing rates as improperly placed substrates may be detected and corrected before processing the substrate.

While the foregoing is directed to embodiments of the present disclosure, other and further embodiments of the disclosure may be devised without departing from the basic scope thereof.

The invention claimed is:

1. A method for detecting substrate placement in a process chamber, comprising:
   placing a substrate on a support surface of a substrate support within the process chamber;
   modifying a pressure within the chamber to create a detection pressure within the chamber;
   sensing a first temperature of the substrate support when the pressure within the chamber reaches the detection pressure;
   monitoring a thermal response characteristic of the substrate support after placing the substrate on the substrate support;
   comparing the thermal response characteristic to a predetermined response characteristic; and
   determining whether the substrate is placed correctly based upon the comparison of the thermal response characteristic to the predetermined response characteristic.

2. The method of claim 1, wherein the chamber is maintained at or above the detection pressure for a detection time.

3. The method of claim 2, wherein the thermal response characteristic is monitored for a duration of the detection time.

4. The method of claim 1, wherein monitoring the thermal response characteristic includes monitoring one or more of a substrate support temperature, a temperature of a heat transfer medium, or a power requirement of a thermal element in the substrate support.

5. The method of claim 1, wherein the thermal response characteristic is proportional to a temperature gradient between the substrate and the substrate support.

6. The method of claim 1, wherein modifying a pressure within the chamber occurs subsequent to placing the substrate on the support surface.

7. The method of claim 6, wherein sensing the first temperature occurs subsequent to modifying the pressure within the process chamber.

8. The method of claim 1, further comprising:
   generating a first signal if the thermal response characteristic corresponds to a first predetermined response; and
   generating a second signal if the thermal response characteristic does not correspond to the first predetermined response, wherein the second signal includes initiation of a fault response.

9. The method of claim 8, wherein the first signal allows a process recipe to continue.

10. The method of claim 8, wherein the fault response includes at least one of a warning signal or an interruption of a process.

11. The method of claim 1, wherein confirming the substrate placement includes one or more of:
   a) sensing a temperature of the substrate support;
   b) calculating a change of a substrate support temperature with a change in time;
   c) sensing a temperature of a heat transfer medium;

d) calculating a change of heat transfer medium temperature with a change in time;
e) sensing a power requirement of a thermal element in the substrate support; or
f) calculating a change in the power requirement of a thermal element in the substrate support with a change in time; and comparing one or more of a)-f) with an associated threshold value.

12. The method of claim 1, wherein the monitored thermal response characteristic is recorded.

13. The method of claim 12, wherein the predetermined response comprises one or more recorded thermal response characteristics.

14. A computer readable medium having instructions stored thereon that, when the instructions are executed, cause a method for substrate placement detection on a substrate support in a process chamber to be performed, the method comprising the limitations recited in claim 1.

15. The computer readable medium of claim 14, wherein the method maintains the pressure within the chamber at or above the detection pressure for a detection time.

16. The computer readable medium of claim 14, wherein the method monitors the thermal response for a detection time.

17. A system for processing a substrate comprising:
a chamber defining a processing volume;
a pressure sensor coupled to the chamber to sense a pressure in the processing volume;
a substrate support comprising a temperature sensor disposed within the processing volume;
a placement device to place a substrate upon a surface of the substrate support;
a pressure modification system to modify a pressure within the processing volume; and
a controller comprising a computer readable medium having instructions stored thereon that, when the instructions are executed, cause a method for substrate placement detection on a substrate support in a process chamber to be performed, the method comprising:
placing a substrate on a support surface of the substrate support;
modifying a pressure within the chamber to create a detection pressure within the chamber;
sensing a first temperature of the substrate support when the pressure within the chamber reaches the detection pressure;
monitoring a thermal response characteristic of the substrate support after placing the substrate on the substrate support;
comparing the thermal response characteristic to a predetermined response characteristic; and
determining whether the substrate is placed correctly based upon the comparison of the thermal response characteristic to the predetermined response characteristic.

18. A method for detecting substrate placement in a process chamber, comprising:
placing a substrate on a support surface of a substrate support;
monitoring a thermal response characteristic of the substrate support after placing the substrate on the substrate support, wherein monitoring the thermal response characteristic occurs subsequent to modifying a pressure within the process chamber to a detection pressure; and
determining whether the substrate is placed correctly based upon the monitored thermal response characteristic.

19. The method of claim 18, wherein the thermal response characteristic is one or more of a temperature of the substrate support, a temperature of a heat transfer medium provided to the substrate support, or a power requirement of a thermal element in the substrate support.

* * * * *